(12) United States Patent
Mayor

(10) Patent No.: US 7,944,760 B2
(45) Date of Patent: May 17, 2011

(54) READ ENHANCEMENT FOR MEMORY

(75) Inventor: Cedric Mayor, Overasselt (NL)

(73) Assignee: NXP B.V., Eindhoven (NL)

( * ) Notice: Subject to any disclaimer, the term of this patent is extended or adjusted under 35 U.S.C. 154(b) by 172 days.

(21) Appl. No.: 12/513,695

(22) PCT Filed: Oct. 29, 2007

(86) PCT No.: PCT/IB2007/054384
§ 371 (c)(1),
(2), (4) Date: May 6, 2009

(87) PCT Pub. No.: WO2008/056294
PCT Pub. Date: May 15, 2008

(65) Prior Publication Data
US 2010/0020624 A1    Jan. 28, 2010

(30) Foreign Application Priority Data
Nov. 8, 2006  (EP) .................................... 06291741

(51) Int. Cl.
*G11C 7/00*   (2006.01)
*G06F 17/50*  (2006.01)
(52) U.S. Cl. .................... 365/189.15; 365/148; 365/158
(58) Field of Classification Search ............. 365/189.15, 365/189.011, 189.07
See application file for complete search history.

(56) References Cited

U.S. PATENT DOCUMENTS

| | | | |
|---|---|---|---|
| 5,848,002 A | 12/1998 | Inada et al. | |
| 5,933,366 A | 8/1999 | Yoshikawa | |
| 6,282,145 B1 | 8/2001 | Tran et al. | |
| 6,577,525 B2 | 6/2003 | Baker | |
| 6,597,598 B1 | 7/2003 | Tran et al. | |
| 6,795,359 B1 | 9/2004 | Baker | |
| 6,930,942 B2 | 8/2005 | Baker | |
| 7,142,464 B2 * | 11/2006 | Dadashev | 365/189.09 |
| 2004/0008543 A1 * | 1/2004 | Kato | 365/189.01 |
| 2006/0044907 A1 | 3/2006 | Forbes et al. | |
| 2006/0268644 A1 * | 11/2006 | Boas et al. | 365/225.7 |

FOREIGN PATENT DOCUMENTS

| | | |
|---|---|---|
| EP | 1467377 A | 10/2004 |
| EP | 1699054 A | 9/2006 |
| WO | 2007/005634 A | 1/2007 |

* cited by examiner

*Primary Examiner* — Richard Elms
*Assistant Examiner* — Hai Q Pham

(57) ABSTRACT

An electronic circuitry is provided for reading out a memory element (ME). The electronic circuitry comprises a first electronic path (IP) being coupled to the memory element (ME), a second electronic path (RP) having predetermined electrical properties, and a basic detection element (BDE) being coupled to the first and second electronic paths (IP, RP) such that the information contained in the memory element (ME) can be determined by the basic detection element (BDE) based on the relation of a digital signal being propagated over the first path (IP) to a digital signal being propagated over the second path (RP).

8 Claims, 5 Drawing Sheets

READ ENHANCEMENT FOR MEMORY

FIELD OF THE INVENTION

The invention relates to memory devices, more specifically to an electronic circuitry for reading information contained in a memory element a corresponding method for reading out information and a method for designing a circuitry for reading information contained in a memory element.

BACKGROUND OF THE INVENTION

It is known in the art to store information or data in various kinds of memories. Generally, memory devices are known, which store information by electrical charges on capacitances, or by changes in resistance in an either volatile or non-volatile manner.

One example for a memory element is a polysilicon fuse. In order to write information on the fuse, typically a small conductive path of polysilicon is provided to be destroyed by an over current imposed to the path. Other techniques apply external laser light to dissect conductive portions of the fuse. A modified fuse, exhibits modified electrical properties, e.g. a larger electrical resistance, than the unmodified one. The modified state is also called the "written" state or the "blown" state, since a specific part of the fuse is destroyed. The written (or modified) state is usually associated with a logic value, for example a logic '1'. Accordingly, the unmodified state is assigned to logic '0'. However, for the present invention, these convention are only relevant to ease the understanding of the illustrative embodiments.

Once, the physical characteristics of a polyfuse are modified, the written fuse provides an increased electrical resistance, the value of which can be in an order of magnitude higher than the resistance of the unmodified fuse. Combinations of modified and unmodified non-volatile memory elements represent a specific information stored permanently on the memory elements.

Another new class of non-volatile memories is based on the use of materials having a programmable resistance. Memories based on these materials have the advantage that they can be better scaled down to smaller sizes than charge-based memories such as DRAM. The most prominent technologies are magneto-resistive random access memories (MRAM), phase change memory, the programmable metallisation cell (PMC), the RRAM, and molecular storage.

Generally, the storage elements of the above technologies are resistors with at least two non-volatile resistance states. A particular resistance state can be programmed by application of either a voltage, a current, or both. The above mentioned memory elements can be used as read-only memories or as rewritable memories. Magneto-resistive random access memories (MRAM) are non-volatile memory devices, wherein the information is stored by means of magnetic charge elements. This kind of memories uses material properties that changed their electrical resistance, when a magnetic field is applied. Data retrieval is a simple matter of detecting the relative resistance. Different mechanisms are known in the art. Other memories to which the invention relates are ferroelectric RAM (FRAM).

Still another example for a memory element being susceptible for the present invention is an EEPROM, in particular a flash EEPROM. These elements provide a floating gate, which is isolated from the control gate. The floating gate is charged or discharged by different mechanisms, such that the electrical properties of the device, in particular of the channel through the device are modified. The modification can be permanent, or temporary.

According to prior art reading mechanisms for the above memory elements, the information stored on a memory element is evaluated by means of a complex analogue circuitry. The value representing the stored information of the memory element is usually converted in either a current or a voltage difference. For resistive memory devices, the memory element is usually coupled to a current source or a voltage source, supplying a defined current or a voltage to the device such that the corresponding current or voltage arising on the element relates to its resistance. For memory elements based on charges stored on capacitors, there is usually a sensing amplifier or the like for determining whether there is a specific charge on the capacitor representing the stored information. The output voltage of the sense amplifier indicates the stored information, wherein usually the stored information is destroyed.

The so established voltage or current value, represents the stored value in itself or it is compared to a reference value, that is usually generated by use of a reference element of a predefined value. The voltage or current values relating to the reference element and the memory element are compared by means of a comparator. The result of the comparison indicates, whether the element is in a modified or unmodified state.

One drawback of the described prior art solution consists in the high power consumption phase while the currents or voltages are applied during the read out of the information contained in the memory element. High power consumption is disadvantageous particularly for mobile devices, i.e. low power applications. To overcome this problem, prior art solutions suggest to lower the supply voltage for further power savings. However, such a measure impairs analogue sensing sensitivity and robustness and impacts the yield and the reliability of the measuring devices severely. As for integrated circuitry, to maintain sufficient reliability of the electrical design behavior, designers must increase the dimensions of the integrated components to meet the matching requirements, which in turn, leads to a dramatic bit cell size overhead. The same problem arises from the ongoing downscaling of integrated devices entailing lower supply voltages.

U.S. Pat. No. 6,930,942 B2 discloses a method and an apparatus for measuring current for memory cell sensing purposes. The sensing circuit includes an amplifier, a capacitor, a current source circuit, a clocked comparator, and a clocked counter. The current source circuit operates responsive to an output of the comparator to supply or withdraw current to and from the capacitor during respective charging and discharging intervals. The count in the clocked counter results from periodic comparisons of the capacitor voltage with the reference voltage and is, therefore, related to the logic state of the memory cell.

SUMMARY OF THE INVENTION

It is an object of the invention to provide a read-out mechanism for a memory element having lower power consumption and higher reliability.

The object is solved by an electronic device comprising electronic circuitry for reading out a memory element. The circuitry comprises a first electronic path coupled to the memory element; a second electronic path has predetermined electrical properties, and a basic detection element is coupled to the first and second electronic paths. Wherein, the first and second electronic paths are coupled to each other on one side to provide a common input node, wherein a digital signal supplied to the common input node propagates over the first electronic path and the second electronic path; and the basic detection element is configured to determine the information contained in the memory element based on respective time delays of said digital signal propagating over the first path and the second path from the common input node to the basic detection element.

The digital signals passed over the first and second paths, respectively, have predetermined properties such as for example predefined edges, slopes, or levels and a predefined timing in relation to each other. According to the invention, the information stored in the memory element is transformed into a specific relation of the two digital signals resulting from the digital signal supplied to the common input node. As an example, the information can reside in a deviation of the logical levels or in a change of the timing of the digital signals. The established deviations are an effect of the different electrical properties of the first and second paths. Apparently, the coupling of the element to the first path is arranged such that, the over all electrical properties of the first path depend on the modification state of the memory element.

The basic detection element may be any kind of logic gate or combination of logic gates and latches, or the like. The basic detection element must only be suitable to produce an output signal in response to the two digital signals, or in other words, in response to at least one digital signal and a respective reference signal, indicating the information contained in the deviation of the signals generated according to the previously described configuration.

Compared to prior art solutions, the only power needed for reading out the memory element is limited to the power necessary to pass the digital signals over the two electrical paths including the evaluation carried out by the basic detection element. As there is no particular comparison of the analogue voltage levels or the analogue current levels, the solution according to the present invention provides lower power consumption and less susceptibility to component properties. The present invention is therefore particularly advantageous to be implemented as an integrated circuits.

According to an aspect of the invention the memory element is a non-volatile memory element. Although the present invention is also applicable to volatile memory elements, as also the influence of a temporary change of electrical properties such as electrical resistances or electrical capacitance can be detected based on time delays of digital signals, non-volatile memory elements provide rather permanent changes of the electrical properties, which are more easily detectable.

According to an aspect of the invention the memory element stores information based on a modification of the electrical resistance of the memory element. As many non-volatile memory elements provide changes of the resistance, this aspect of the invention is beneficial for a wide variety of memory elements.

According to an aspect of the invention, the memory element is a memory element, like a polysilicon fuse, an EEPROM, or flash EEPROM, MRAM, FRAM, or the like. However, the scope of the present invention is generally not limited to any particular memory devices as long as the electrical properties of the device are changed in a manner that applies modifications on a digital signal propagating over an electrical path. Such a change of electrical properties can be established by changes in resistivity, capacitance, but also by a simple charge contained on a capacitor.

According to an aspect of the invention, the information contained in the memory element is determined by the basic detection element based on the relation of the respective time delays imposed to a digital signal while propagating over the first path and the second path, respectively. Two predetermined digital signals are propagated over the first path and the second path, respectively. The first and the second paths delay the digital signal in accordance with their electrical properties, wherein the properties of the first path vary in accordance with the state of the memory element. In this respect, the memory element can be arranged in series with the first path. Accordingly, an increased electric resistance of the memory element adds to the electric resistance of the first path. The over all delay of each path depends on the capacitive load, due, for example, to parasitics and the resistance. However, it is also possible to couple a capacitor to each of the two paths.

In order to simplify the structure, the inputs of the two paths can be coupled on one side to provide a common input node. According to this aspect of the invention, the identical digital signal can be easily fed into both paths.

The present invention allows the first path to be coupled with any kind of memory element that changes the electrical properties of the path sufficiently and permanently. However, it is particularly preferred that the memory element is a polysilicon fuse. The properties of polysilicon fuses are well known. Additionally, the polyfuse provides a very large difference of its electric resistance from the unmodified to the written state. Large deviations of the resistance ease the requirements for the evaluation by use of digital signals and so for the basic detection element.

It is also an aspect of the invention that the second path is coupled to a reference element having predetermined electrical properties, and the first and the second paths are each coupled to a capacitor, respectively. This is particularly helpful in order to establish well defined properties of the reference path. Further, the time delay can be increased by providing capacitors for each path.

According to another aspect of the invention, the basic detection element is preferably a D-flip-flop. Accordingly, the data input of the D-flip-flop can be connected to the first path and the clock input can be connected to second path. This embodiment of the present invention is particularly simple, occupies only little area for integrated solutions and is therefore highly effective. The D-flip-flop is triggered by the slopes of the digital signal arriving over the second path. The logic values occurring on the first path are latched to the output of the flip-flop at times imposed by the signal on the second path. The data at the output of the flip-flop will vary in accordance with the input values, the input values being subject to electrical properties of the first path. Since these properties change with the state of the element coupled to the first path, the digital output of the flip-flop exhibits two different data streams, one representing an unmodified memory element, the other a modified element.

According to an aspect of the invention, provisions are made that the electrical resistance of the memory element in a modified state is approximately ten times the resistance in an unmodified state. This aspect of the invention takes account of constraints imposed by the different technologies used to implement the invention. Some of these technologies may require larger deviations in the resistance than others.

The present invention also provides a data processing system including an electronic device according to the invention and in accordance with the above explanations. The present invention is particularly useful for memory devices including a large number of memory elements.

The object set out above, is also solved by the following method for reading information contained in a memory element. The method according to the invention includes the steps of propagating a digital signal over a first path, wherein the first path is coupled to the memory element, and propagating the digital signal over a second path, the second path being a reference path having predetermined electrical properties. The information contained in the memory element is determined by evaluating the digital signal on the first path in relation to the digital signal on the second path.

Accordingly, the present invention discloses a solution where the change in polyfuse resistance is translated in a digital value. The increase in the resistor value for a modified fuse entails a longer charge time for a load capacitor coupled to the modified resistor. However, instead of measuring the voltage across the capacitor, the delay imposed to a digital signal propagating over a path in series with a modified polyfuse is evaluated. Accordingly, the state of the fuse is read in a mere digital manner. If a data pulse arrives too late at the basic detection element, for example a D flip flop, due to higher resistance of a blown fuse, it will be read as a '0'. If the data pulse arrives in time, it will be read as '1'.

The skilled artisan will understand that the set up according to the present invention depends on the technology used for its implementation such that for a certain process particular values of the reference resistors have to be established.

An important aspect of the invention relates to using the benefit of the resistor increase to increase the RC value of an electrical path, which could then be detected by standard CMOS logic. The present invention relates to a change in the evaluation of the fuse itself. Since the semiconductor technology explores regions beyond submicron scale, the interconnection networks experience much higher RC timing constants. Accordingly, the delays evoked by the interconnection networks are much higher than those imposed by transistor elements. However, the large RC timing constants of submicron networks can be used favorably in the context of the present invention.

According to an aspect of the invention, the fuse resistor's variability is used to directly modify timing constrains of a purely CMOS digital design. Accordingly, the information contained e.g. in a polyfuse resistor is coded for read out as, for example, a time shift during the read operation. The read operation relates to latching the level of an informative signal with respect to a slope of a reference signal, for example a reference clock. If the same signal that is passed along the reference path is applied to the information path, the same edges arising on the reference path will occur on the information path. Accordingly, the rising and falling edges are delayed relation to the properties of the information path. The factor by which the rising and falling edges are delayed with respect to a reference signal depend on the properties of the fuse in the modified (written) or unmodified state. It might be the same signal that is propagated over two different paths being practically coupled to each other at the input point such that one path carries the reference signal and the other the informative one. The basic detection element serves to determine whether the two signals are in time or shifted with respect to each other.

BRIEF DESCRIPTION OF THE DRAWINGS

These an other aspects of the invention are apparent from and will be elucidated with reference to the embodiments described hereinafter and with respect to the following figures.

DETAILED DESCRIPTION OF THE EMBODIMENTS

Figure 1:
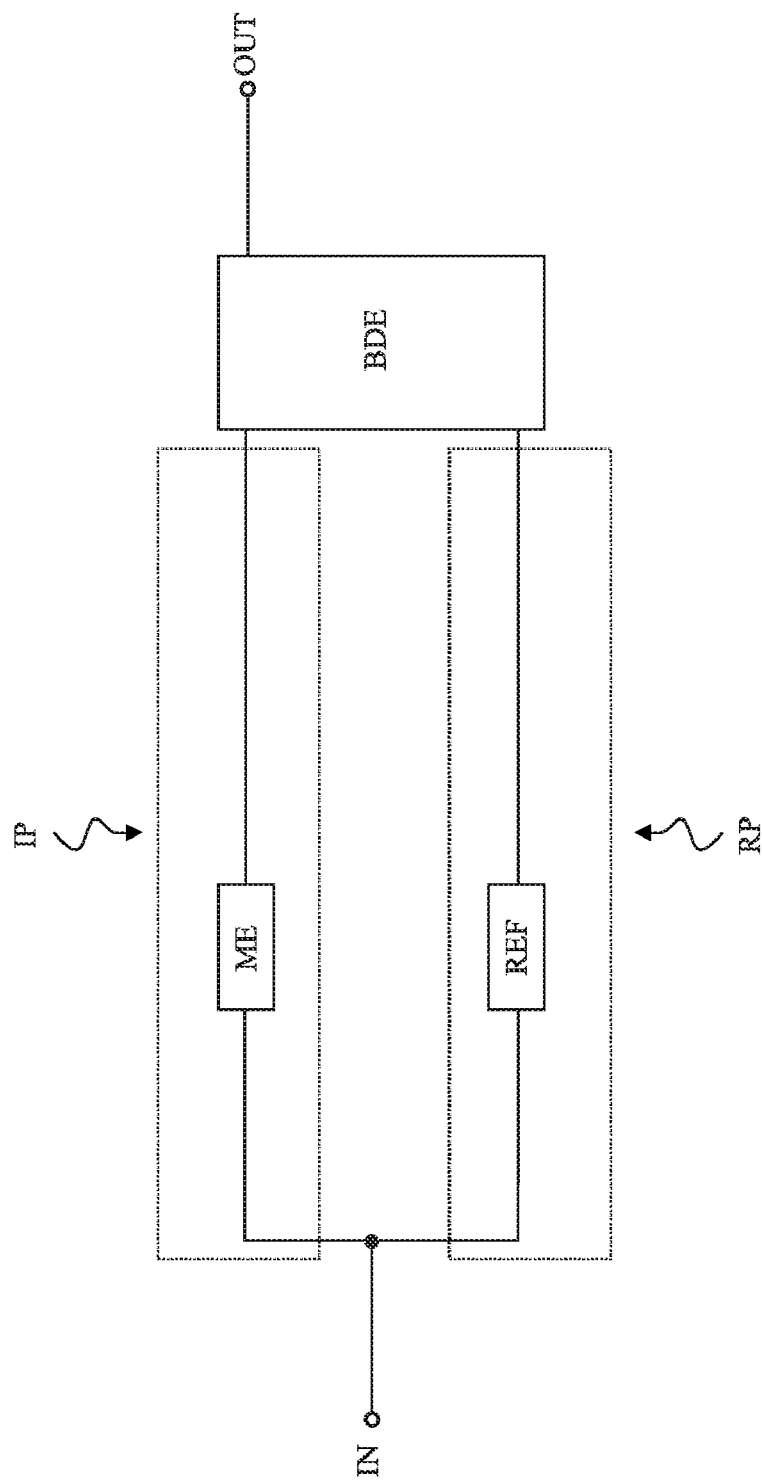
FIG. 1 shows a simplified schematic of an electronic circuitry according to the present invention.

FIG. 1 shows a simplified basic arrangement according to an embodiment of the present invention. The information path IP includes the memory element ME. The reference path RP includes a reference element REF. However, the reference path RP does not need to provide a reference element REF as long as the electrical properties of the reference path RP are known, and as long as those properties are suitable for the invention. According to the embodiment shown in FIG. 1, a reference element REF is coupled to the reference path. This reference element is designed in relation to the electrical properties of the memory element ME. If for example, the memory element ME is a polysilicon fuse, having a first resistance in a unwritten state and a second resistance in written state, the reference element can be designed to provide a resistance that is approximately in the middle of these values. The memory element can also be one of the above mentioned elements, as MRAM, FRAM, PMC, or an EEPROM device or a flash EEPROM cell or the like and even memory elements of still other technologies as will be described below. The two electrical paths IP, RP are connected on their left side to provide a common input IN. Accordingly, a digital signal can be supplied to the input the propagates over the information path IP and the reference path RP. However, a true electrical connection is not necessary if digital signals with predetermined properties and timing are supplied to the paths IP and RP. The basic detection element BDE is coupled to the respective other ends of the two paths IP and RP. When a digital signal is asserted to the input IN, it propagates over the two paths IP and RP in parallel and arrives at the basic detection element. According to the delays imposed to the digital signal by either path, the edges and accordingly the logic levels of the digital signal at the BDE indicate the state of the memory element. The basic detection element BDE evaluates the digital signals from either path in relation to each other, producing an output signal OUT, that represents the state of memory element ME. The basic detection element can be any kind of logic, a latch, a flip-flop or a combination of components as long as it establishes a different logic value at its output in correspondence with the state of the memory element ME.

Figure 2:
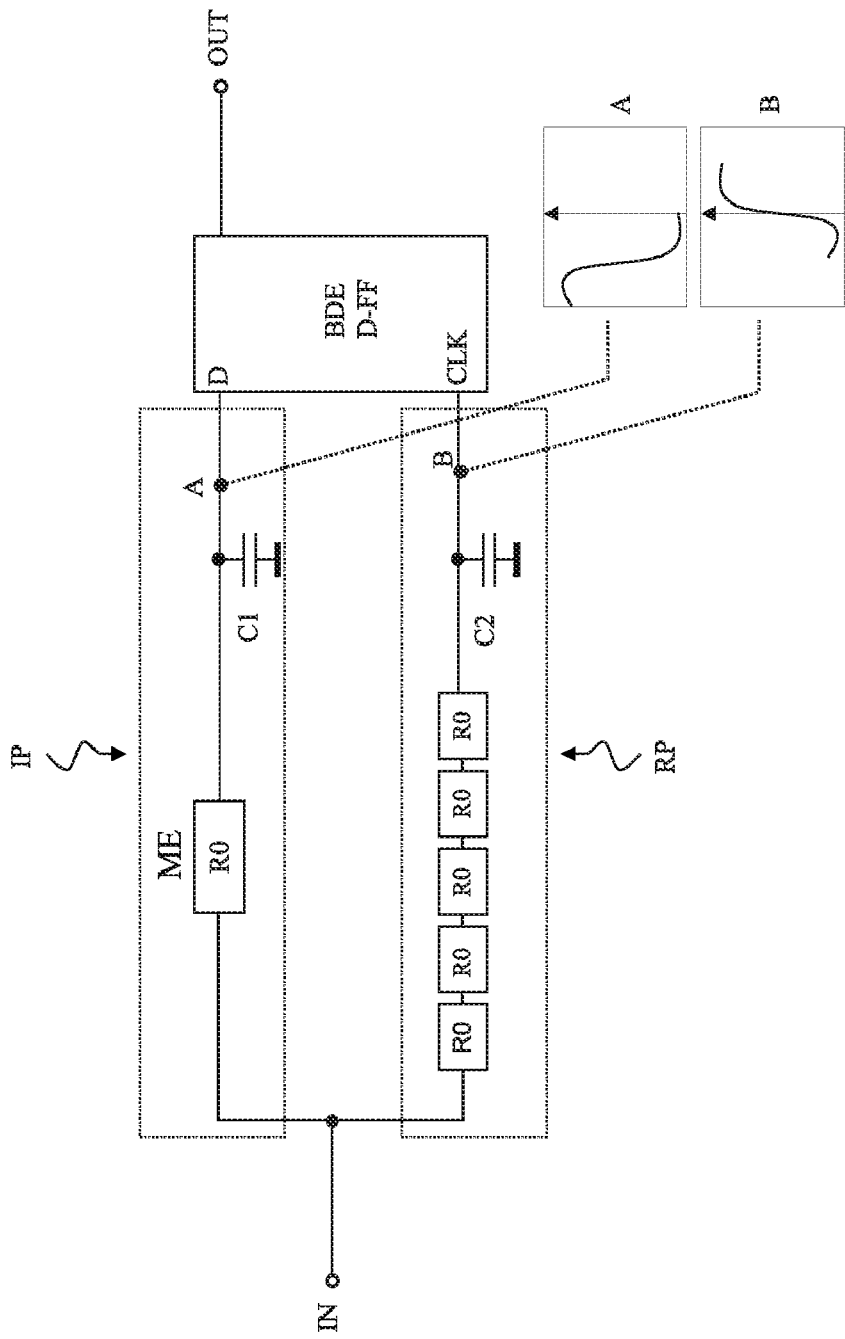
FIG. 2 shows a simplified schematic of an electronic circuitry according to the invention for a read '0' example.

FIG. 2 shows a preferred embodiment of the present invention in more detail. As before, the input signal being asserted at the node IN is carried over the two branches IP and RP, one being the information path IP, the other the reference path RP. The information path RP includes an unmodified memory element ME, e.g. a polyfuse or MRAM, FRAM, PMC etc. having the resistance R0 and a capacitor C1. The information path IP is coupled to a basic detection element BDE, which is implemented as a D-flip-flop. According to the present embodiment, the information path IP is coupled to the data input D of the D-flip-flop. The reference path RP comprises a number of reference elements R0, each representing an electric resistance of substantially the same value R0. The capacitance C2 corresponds to C1. The reference path RP is coupled to the clock input CLK of the D-flip-flop. The diagrams A and B depict extracts of the timing diagrams of the informative signal and the reference signal close to the D-flip-flop. Diagram A shows a falling slope for the informative signal such that the rising edge shown in diagram B occurs when the signal A is at a logic '0' state. Accordingly, the D flip flop, will produce a '0' at the output OUT. This indicates that the memory element ME in the information path IP is in an unmodified (unwritten) state having a resistance of approximately R0. R0 may be 10 ohm for a polyfuse.

Figure 3:
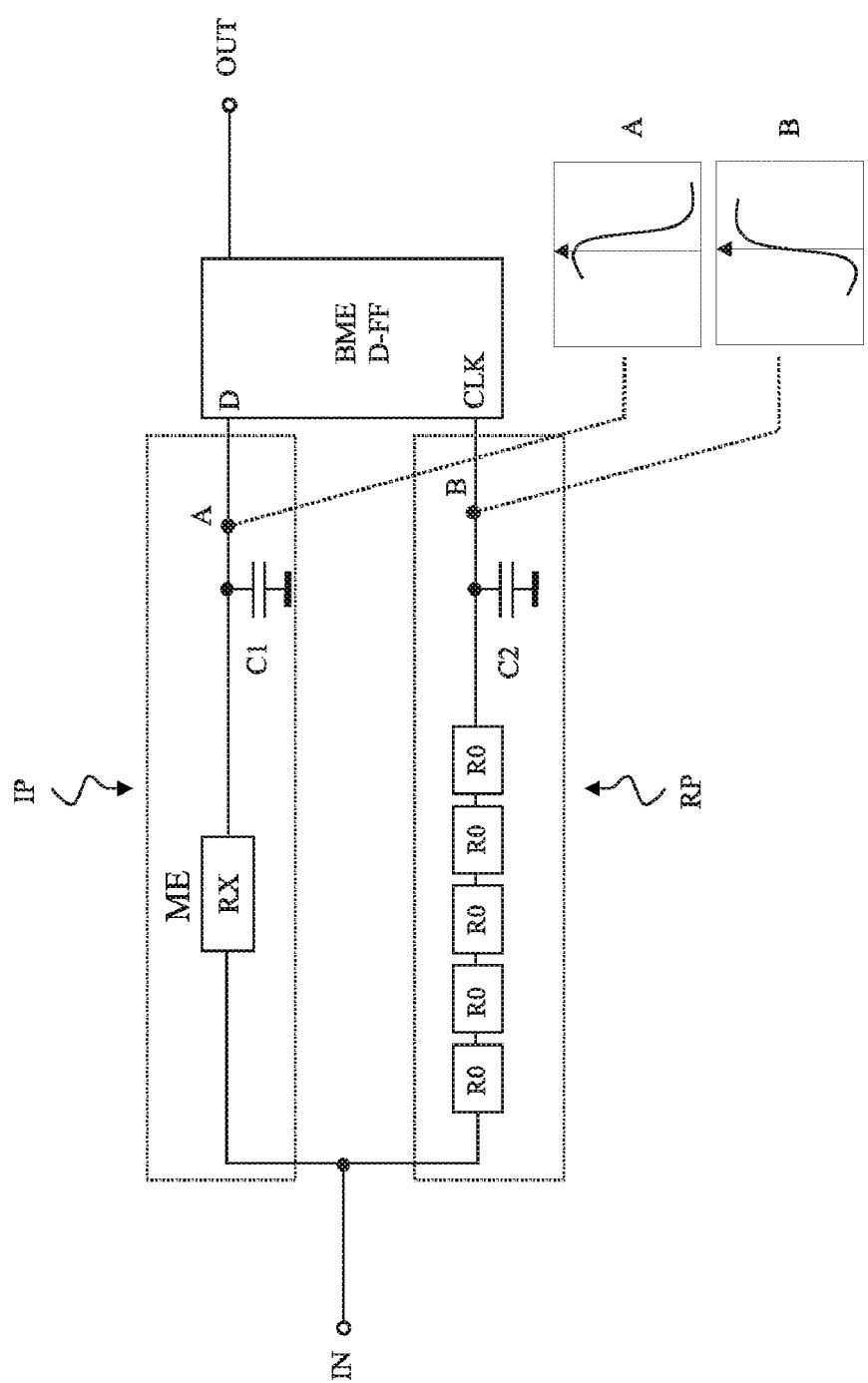
FIG. 3 shows a simplified schematic of an electronic circuitry according to the invention for a read '1' example.

FIG. 3 shows substantially the same components as shown in FIG. 2 except that the memory element ME in the information path IP is now in a written (blown) state. Accordingly, the resistance of the memory element ME can amount to RX which amounts in the present example to ten times R0 for e.g. a polyfuse. Accordingly, the falling edge in diagram A is more delayed than in FIG. 2 by the higher electric resistance RX. As the rising edge of the clock signal shown in diagram B occurs at the same time as before, the output of the D-flip-flop will produce a logic '1' state representing the value written in memory element ME.

Assumed the resistance for the whole information path including the polyfuse in an unmodified state amounts to 10 Ohm, and the capacitor C1 has 50 fF, then the value for the time constant T=R*C of the unmodified information path amounts to 5 ps. If the resistance RX of the information path is ten times higher in the written state of this memory element (e.g. polyfuse), the time constant T=RX*C will be 50 ps.

However, for different memory elements, these numbers may vary substantially. Even if the resistivity of the device undergoes only a very small change, the rather small delays of the digital signals can still be detected. This depends on the technology and in particular on the set up times of logical gates or latches. Since the speed of the logical devices increases with time, there will always be a solution for even the smallest delay.

Figure 4:
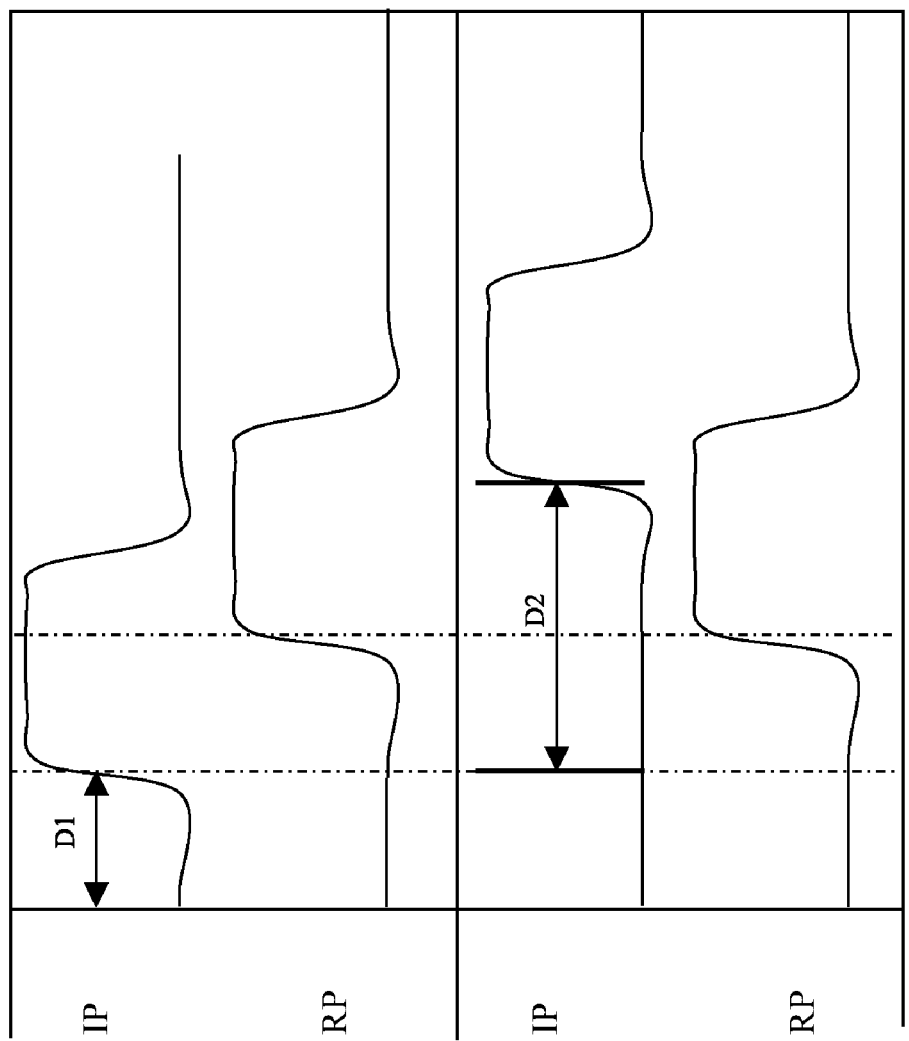
FIG. 4 shows the timing diagram for a read '1' and a read '0' for a data pulse as a digital signal according to the present invention.

FIG. 4 shows another example of waveforms for a digital signal being a pulse of a certain length propagating over the information path IP and the reference path RP according to an arrangement as shown in FIGS. 1 to 3. In the upper part of the diagram in FIG. 4, the delay of the information path IP in the unwritten state of the memory element ME amounts to D1. The signals in the lower half of the diagram of FIG. 4 relate to the written state. Accordingly, an additional delay of D2 is imposed by the memory element in the written state. As the rising edge on the reference path occurs always at the same time, the signal on the information path is captured as '0' in the lower half of the diagram in FIG. 4. and as '1' in the upper half. The strobing window for the clock signal is located between the rising edge of the signal on IP for the read '0 example in the upper half, and the rising edge of the signal on RP.

The memory element of the above embodiments can also be a programmable memory device, for example an MRAM including a programmable resistance. The memory elements can be arranged in rows and columns to form a memory array having word lines and bit lines to individually address memory elements or groups of memory elements. Accordingly, a digital signal can be propagated over the word lines and bit lines in order to experience a delay that is related to the resistance of the memory element on a specific location of the array. The delay inflicted to the digital signal can be compared to the same or a second digital signal with a predetermined relation to the first signal, such that the stored information can be read out in the same manner as described above.

Further, a floating gate device having a control gate, a floating gate, and drain and source areas can be used for the present invention. The information is stored by a specific charge on the floating gate. The electrical properties, in particular the properties of the channel of the floating gate device will change in accordance with the amount of the electrical charge. If a digital signal is now passed through the device from source to drain or vice-versa, the delay or other features of the digital signal will change in accordance with the modification state. So even for these devices, the present invention will be beneficial.

Still another technology to which the present invention can be applied, is silicon on insulator (SOI). The active components of SOI transistors are isolated from the bulk by an isolating layer. Accordingly, there are capacitances carrying charges depending on the voltages between gate, drain and source areas, and bulk of these transistors. These charges can also be used to store information. When released, the charges can contribute a certain amount of delay (or advance) to the propagating slope of a digital signal propagating through or along the device as long as the device is properly coupled to the electrical path carrying the digital signal. Accordingly, also for this kind of devices, and even for parasitic capacitances, the present invention can be applied.

It is therefore also considered to apply the present invention to all kinds of memories, even volatile memories, such as dynamic random access memories (DRAM). Also according to these technologies, charges can be released to an electrical path carrying a digital signal, such that the propagation of the digital signal is influenced by the released charge. Specific considerations relating to the timing of the signals are necessary, while the basic idea remains the translation of electrical properties of the memory device into digital signaling.

Figure 5:
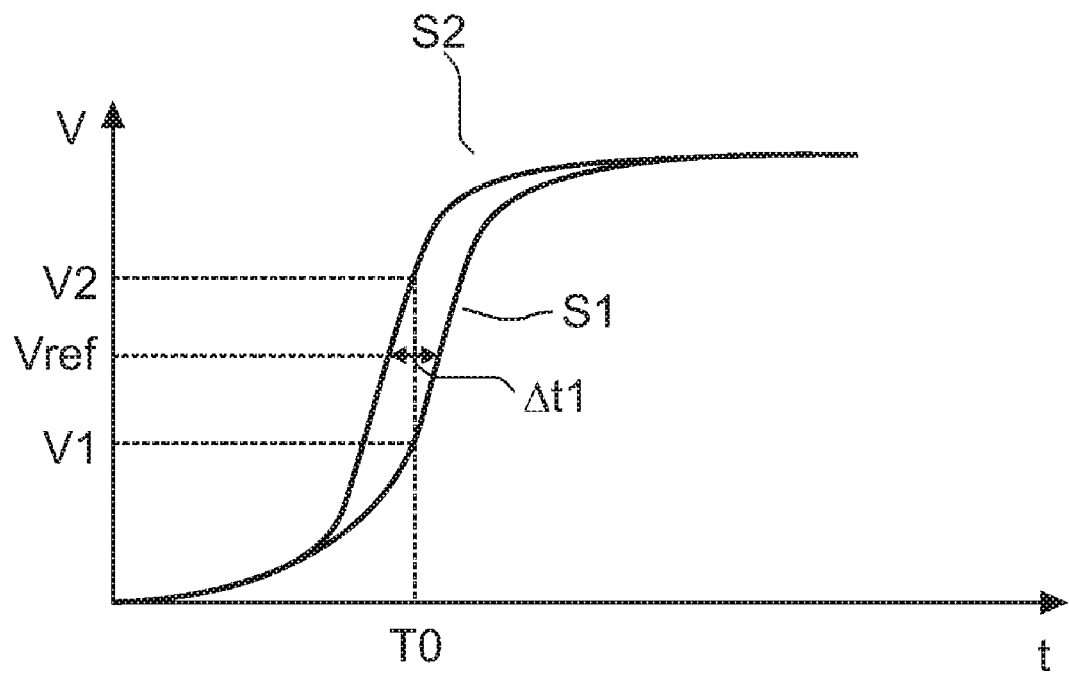
FIG. 5 shows the two slopes of the same digital signal with and without a time delay according to a mechanism according to the present invention.

FIG. 5 shows the slopes of a first digital signal S1 and a second digital signal S2 as they may occur, if the present invention is applied to one of the above mentioned memory elements. The slopes of the signals S1 and S2 are delayed with respect to each other by a time delay of $\Delta t$. The value of the digital signals can be detected at detection time T0. Accordingly, digital signal S1 will be detected at time T0 by a voltage V1 by a basic detection element BDE as described above. The digital signal S2 will be detected by its value V2 at the same time T0. If an appropriate reference voltage is defined as Vref located approximately in the middle between the two values V1 and V2, even a rather small time delay can be detected. The basic idea resides in conveying a voltage difference into a time difference of a digital signal. The capability of the technology is a key factor to be able to generate a sufficient mismatch and to detect it, but this is related to technology and one of the common considerations the technical expert has to make.

The invention is useful for all kinds of digital integrated circuits using memory and helps to replace the area consuming analogue read circuits currently implemented e.g. for the non-volatile fuse bit cells. The bit cell according to the present invention could be used in a vast area of applications generally requiring chip ID, memory redundancy with a self reparable block, or for any encryption for security code purposes. In particular for the last application, the lower power consumption according to the present invention is advantageous as for example for mobile applications.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere effect that certain measures are resided in mutually different dependent claims does not indicate that a combination of these measures cannot be used as advantage.

Furthermore, any reference signs in the claims shall not be considered as limiting the scope of the claims.

The invention claimed is:

1. Electronic device comprising electronic circuitry for reading out a non-volatile memory element, the circuitry comprising
    a first electronic path being coupled to the non-volatile memory element,
    a second electronic path having predetermined electrical properties,
    a basic detection element being coupled to the first and second electronic paths wherein,
    the first and second electronic paths are coupled to each other on one side to provide a common input node, wherein a digital signal supplied to the common input node propagates over the first electronic path and the second electronic path, and
    the basic detection element is configured to determine the information contained in the memory element based on respective time delays of said digital signal propagating over the first path and the second path from the common input node to the basic detection element.

2. Electronic device according to claim 1, wherein the information stored in the memory element is based on the modification of a resistance.

3. Electronic device according to claim 1, wherein the second path is coupled to a reference element having predetermined electrical properties, and the first and the second paths are each coupled to a capacitor, respectively.

4. Electronic device according to claim 1, wherein the memory element (ME) belongs to at least one of the following technologies, a poly-silicon fuse, MRAM, FRAM, PCM, EEPROM, flash EEPROM.

5. Electronic device according to claim 1, wherein the basic detection element comprises a D-flip-flop,
    the first path being coupled to a data input of the D-flip-flop, and the second path being coupled to the clock input of the D-flip-flop.

6. Electronic device according to claim 4, wherein the electrical resistance of the memory element in a modified state is approximately ten times the resistance in an unmodified state.

7. Data processing system comprising an electronic device according to claim 1.

8. Method for reading information contained in a memory element comprising:
    propagating a digital signal over a first path, the first path being coupled to the memory element,
    propagating the digital signal over a second path, the second path having predefined electrical properties, and
    determining the information contained in the memory element by evaluating the digital signal on the first path in relation to the digital signal on the second path.

* * * * *